United States Patent [19]

Alferness

[11] Patent Number: 4,750,801
[45] Date of Patent: Jun. 14, 1988

[54] OPTICAL WAVEGUIDE RESONATOR FILTERS

[75] Inventor: Rodney C. Alferness, Holmdel, N.J.

[73] Assignee: American Telephone and Telegraph Company, AT&T Bell Laboratories, Murray Hill, N.J.

[21] Appl. No.: 782,133

[22] Filed: Sep. 30, 1985

[51] Int. Cl.$^4$ .............................................. G02B 6/10
[52] U.S. Cl. .............................. 350/96.12; 350/96.13
[58] Field of Search ............... 350/96.11, 96.12, 96.13, 350/96.14

[56] References Cited

U.S. PATENT DOCUMENTS

| 3,884,549 | 5/1975 | Wang et al. | ...................... 350/96.12 |
| 4,461,535 | 7/1984 | Marcatili | ...................... 350/96.12 X |

OTHER PUBLICATIONS

*Applied Physics Letters*, 24, 1974, pp. 194-196.
*Applied Physics Letters*, 45, 1984, pp. 1278-1280.

*Primary Examiner*—Eugene R. LaRoche
*Assistant Examiner*—Steven J. Mottola
*Attorney, Agent, or Firm*—Richard D. Laumann; Gregory C. Ranieri

[57] ABSTRACT

An optical filter using first and second grating sections separated by a changed refractive index section operates as a narrowband grating resonator.

7 Claims, 1 Drawing Sheet

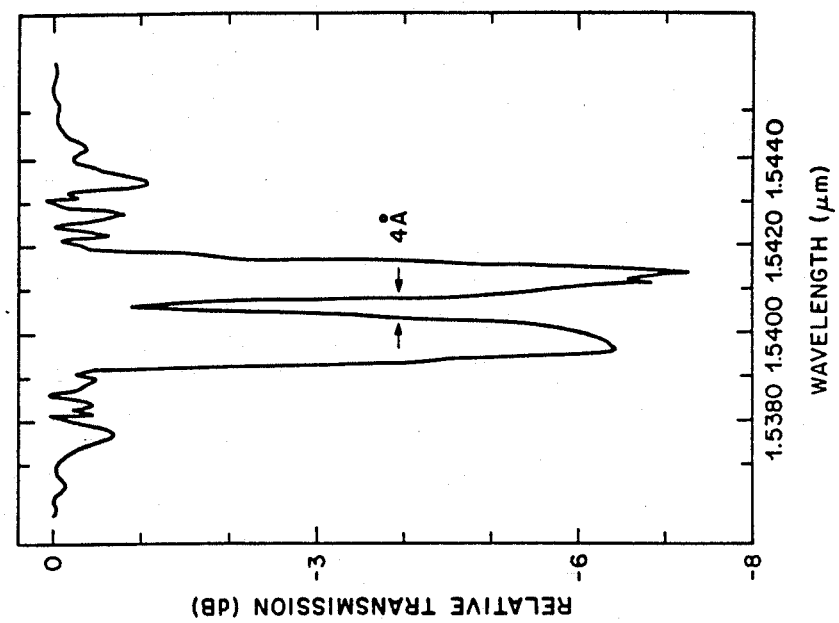
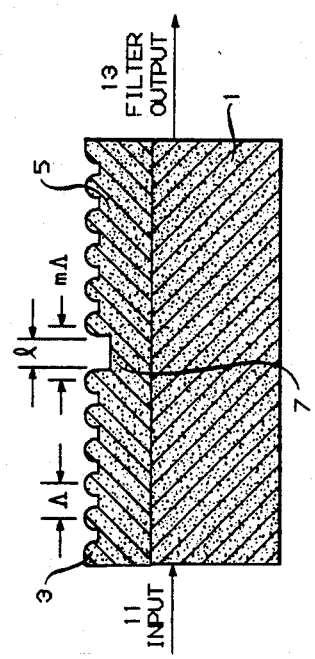
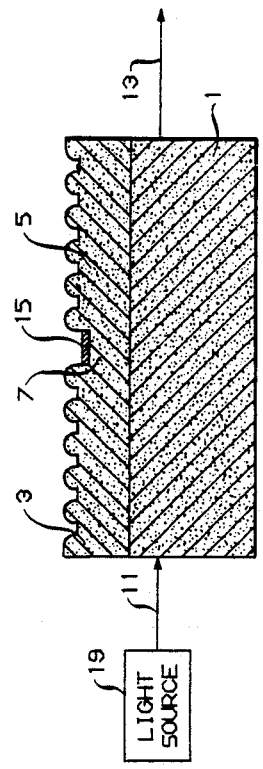

OPTICAL WAVEGUIDE RESONATOR FILTERS

TECHNICAL FIELD

This invention relates generally to the field of optical devices and particularly to optical filters as well as to devices which incorporate such optical filters.

BACKGROUND OF THE INVENTION

Optical filters are important in numerous applications including both optical signal processing and optical communications applications. Likely uses for optical filters include, but are not limited to, wavelength division multiplexing, wavelength discrimination in frequency shift keying (FSK) coherent detection schemes as well as spontaneous emission noise filtering for otical amplifiers. As might be expected, several approaches have been taken in attempts to fabricate optical filters.

Waveguide reflection gratings provide one means of obtaining narrow band wavelength discrimination. This type of filter has been demonstrated in both glass and semiconductor waveguides. See, for example, *Applied Physics Letters,* 24, pp. 194–196, 1974, and *Applied Physics Letters,* 45, pp. 1278–1280, 1984. However, the drawbacks to this type of grating. It is difficult to obtain the desired narrow bandwidths. If the filter is made with strong coupling between the light and the grating, the light is reflected before seeing the entire garting, and the bandwidth is relatively large. If it is made with weak coupling between the light and grating, it must also be made long. In this case, the problems of obtaining both uniform grating and waveguide effective index become very difficult. In spite of these difficulties, filter bandwidth of approximately 6 Angstroms has been obtained for a center wavelength of $\lambda = 1.55$ $\mu$m. It is often desired, however, for many applications that a filter bandwidth less than 1 Angstrom be obtained. Additionally, for some applications, a filter that works in transmission, rather than reflection, is desired.

SUMMARY OF THE INVENTION

A grating resonator filter comprising a substrate and, on said substrate, first and second grating sections and a section of changed effective refractive index, said latter section being between said first and second grating sections yeilds a grating resonator. The two sections are effectively phase shifted with respect to each other by the reduced effective refractive index section which yields the desired II/2 phase shift. The changed effective refractive index section may be termed a phase shift section. In other words, the required II/2 phase shift is obtained by using a nongrating section having a different refractive index than the grating sections have. In one preferred embodiment, the filter is fabricated with semiconductor materials such as Group III-V compound semiconductors including InGaAsP. In yet another embodiment, an electro-optic material is used and an electrode contacts the phase shift section to permit frequency tuning of the optical filter. In still another preferred embodiment, the phase shift section is formed by etching. This produces a reduced effective refractive index. More generally, the phase shift section may have a different refractive index or dimension relative to the grating sections. The filter is useful in devices such as modulators, optical amplifiers, wavelength division multiplexing, as well as other device applications.

BRIEF DESCRIPTION OF THE DRAWING

FIG. 1 is a sectional view of an embodiment according to this invention;

FIG. 2 plots the wavelength horizontally versus the relative transmission vertically for a filter according to this invention; and FIG. 3 is a sectional view of another embodiment according to this invention.

For reasons of clarity, the elements of the devices depicted are not drawn to scale.

DETAILED DESCRIPTION

An exemplary embodiment of a waveguide grating resonator filter according to this invention is schematically depicted in FIG. 1. It comprises substrate 1 and first grating section 3 and second grating section 5 which are disposed on substrate 1. There is also a section 7 between the first and second grating sections and which is termed the phase shift or changed effective refractive index section. The phase shift section has a refractive index which is different from the refractive indices of the grating sections. The first and second grating sections are geometrically in phase with each other. That is, the distrance between a grating peak in the first section and any one in the second grating section is an integer number of grating periods. These gratings are first order gratings with a period $\Lambda$. The phase shift section has a length l. The substrate has a lower refractive index than do the first and second grating sections. Also depicted are the input radiation 11 and filtered output radiation 13.

Conventional fabrication techniques may be used to fabricate the grating resonator filter. That is, well known and conventional lithographic and epitaxial crystal growth techniques may be used. For example, an InGaAsP waveguide layer of approximately 0.7 $\mu$m thickness and having a bandgap wavelength of approximately 1.1 $\mu$m may be grown on n-type, less than $10^{18}/\text{cm}^3$, InP substrates. Other thicknesses and bandgaps may be used. Photoresist is then deposited on the epitaxial layer. First-order gratings having a period $\Lambda$ of 0.2340 $\mu$m are interferometrically written in the photoresist, and then transferred to the quaternary InGaAsP layer by etching with a saturated bromine and phosphoric acid solution. Typically grating depths are between 700 and 1,000 Angstroms with the precise depth depending in well known manner upon the etching time. The photoresist grating mask is now removed and a section having a length, l, is then chemically etched in the planar grating using a photolighographically delineated mask. The etched space or section is typically approximately 500 Angstroms deeper than the grating valleys. The length of the grating reflector is approximately 500 $\mu$m. No residual grating was observed by using a scanning electron microscope. The etched region forms a region of reduced refractive index, i.e., a phast shift section, between the first and second grating sections. This fabrication method insures that with respect to light propagating in the waveguide, the first and second sections are not optically in phase.

The reduced effective refractive index section produces an effective phase shift as it has a section of reduced waveguide thickness and, therefore, of reduced effective refractive index. To obtain the desired relative phase between the two gratings at the resonant wavelenth, it is required that $$(N_1 - N_2)l = \lambda_0/4 \qquad (1)$$

where l is the length of the etched section and $N_1$ and $N_2$ are the effective refractive indices of the grating sections and the etched sections, respectively. The resonant wavelength is $\lambda_0$. The same requirement must be satisfied if the phase shift section has an increased refractive index.

Other embodiments are contemplated. For example, a channel waveguide could be fabricated with the width of the phase shift section differing from the widths of the grating sections. Different fabrication techniques offer possibilities of changing the actual refractive index of the phase shift section with respect to the refractive index of the grating sections. For example, different metals could be indiffused in the grating and phase shift sections to form waveguides of different refractive indices. If semiconductor materials are used, the etching step previously described could be followed by selective regrowth in the etched area of a semiconductor material having a material composition and refractive index different from the grating sections.

Each grating reflector has an identical stopband wavelength region centered about the desired resonant wavelength where it is strongly reflecting. When the above equation (1) is satisfied, strong reflections from the two grating sections are out of phase and result in strong transmission at the resonant wavelength.

A variety of materials for the waveguide may be used. For example, semiconductors such as Group III–V compound semiconductors including InGaAsP may be used. Additionally, lithium niobate may be used. The latter material does not appear as desirable as do the compound semiconductors as there is a relatively small refractive index difference between the waveguide and the substrate and the known techniques for etching lithium niobate do not etch lithium niobate as easily as do the comparable techniques for the etching of semiconductors. However, it has very low loss which is advantageous for very narrowband resonator filters with low insertion loss. The Group III–V compound semiconductors appear desirable because a large refractive index difference between the epitaxial layer and the substrate may be obtained. Additionally, silica may be used.

The response for an exemplary grating resonator according to this invention is depicted in FIG. 2 with the wavelength in μm plotted horizontally versus the relative transmission plotted vertically. The measured response has the shape expected, i.e., an approximately 30 Angstroms wide stopband characteristic of grating reflector with a single transmission resonance in the center. The resonance width, that is, the full width at half maximum, is approximately 4 Angstroms. The excess resonator loss is approximately 0.9 dB. This permits the waveguide losses to be estimated at 5 dB/cm, which is a value consistent with losses in similar uncorrugated waveguides. Assuming this loss coefficient is accurate, the filter bandwidth is not loss-limited but rather is limited by leakage through the grating mirrors.

With a resonator having increased grating reflectivity, both the width and depth of the stopband can be increased and the resonance bandwidth decreased. Filter bandwidths as small as 1 Angstrom have been obtained. For the waveguide losses mentioned, a filter bandwidth less than 0.25 Angstrom should be achievable.

The filter is useful in numerous devices. For example, it may be used with an optical amplifier as shown in FIG. 3. In addition to the elements described with repect to FIG. 1 and designated by identical numerals, the filter also comprises an electrode 15 to the reduced effective refractive index or phase shift section. A source 19 of input light is also shown. The source is typically a laser; for example, a semiconductor laser and is optically coupled to the first grating section, i.e., its emitted light enters the first grating section. This source has a spectrum broader than that desired. The electrode permits tuning of the filter passband to the desired frequency.

The filter may also be used to modulate light from a laser. This is easily done by using the embodiment depicted in FIG. 3. The electrode, upon application of an appropriate voltage, modulates the electro-optic effect, and thereby changes the position of the resonant wavelength. This permits the effective transmission of the filter to be varied between two values such as 0.0 and 1.0.

The phase shift section need not be positioned symmetrically with respect to the first and second grating sections. For some situations, it is desirable that a grating length on the input side be of a different length than on the output side.

Other embodiments are contemplated. For example, it will be readily appreciated that the filters may cascaded. That is, more than two grating sections may be used with a corresponding increase in the number of reduced effective refractive index sections. Additionally, second order gratings may be used for some applications.

What is claimed is:

1. An optical filter comprising a substrate having a first refractive index and, disposed on said substrate, first and second grating sections and a waveguide phase shift section, said first and second grating sections being geometrically in phase with each other and spatially separated from one another, said waveguide phase shift section being between said first and second grating sections and for introducing an optical phase shift of $\pi/2$ between said first and second grating sections.

2. A filter as recited in claim 1 in which said sections comprise a compound simiconductor.

3. A filter as recited in claim 2 in which said compound semiconductors comprise Group III–V compound semiconductors.

4. A filter as recited in claim 1 in which said sections comprise lithium niobate.

5. A filter as recited in claim 1 in which said sections comprise silica.

6. A filter recited in claim 1 further comprising an electrode to said phase shift section.

7. A filter as recited in claim 1 further comprising a light source, said light source being optically coupled to said first grating section.

* * * * *